United States Patent [19]

Akao et al.

[11] Patent Number: 5,047,130
[45] Date of Patent: Sep. 10, 1991

[54] METHOD AND APPARATUS FOR MAGNETRON DISCHARGE TYPE SPUTTERING

[75] Inventors: Yasuhiko Akao; Takehiro Sakurai, both of Fuchi, Japan

[73] Assignee: Anelva Corporation, Tokyo, Japan

[21] Appl. No.: 420,043

[22] Filed: Oct. 11, 1989

[30] Foreign Application Priority Data

Oct. 17, 1988 [JP] Japan ................................ 63-260991

[51] Int. Cl.⁵ .............................................. C23C 14/35
[52] U.S. Cl. ............................... 204/192.12; 204/298.2
[58] Field of Search ......................... 204/192.12, 298.2

[56] References Cited

U.S. PATENT DOCUMENTS 4,746,417 5/1988 Ferenbach et al. ............... 204/298.2

FOREIGN PATENT DOCUMENTS 0211412 2/1987 European Pat. Off. ......... 204/298.2
0248244 12/1987 European Pat. Off. ......... 204/298.2
62-60866 3/1987 Japan .................................. 204/298.2

Primary Examiner—Aaron Weisstuch
Attorney, Agent, or Firm—Edward D. Manzo

[57] ABSTRACT

Magnetron discharge type sputtering apparatus for sputtering a target with plasma. The apparatus comprises a flat target, a magnetic field application unit disposed in the vicinity of the back surface of said target and rotating means for rotating a magnetic field provided on the surface of the target by said magnetic field application unit. The magnetic field application unit is constructed such that erosion produced in the target by the sputtering tends to be deeper at an edge portion of an erosion area than at a central portion thereof. Further, there is disclosed a method of magnetron plasma discharge type sputtering of a flat target, wherein erosion produced in the target by the sputtering tends to be deeper at an edge portion of the target than at a central portion thereof.

19 Claims, 5 Drawing Sheets

FIG_1
PRIOR ART
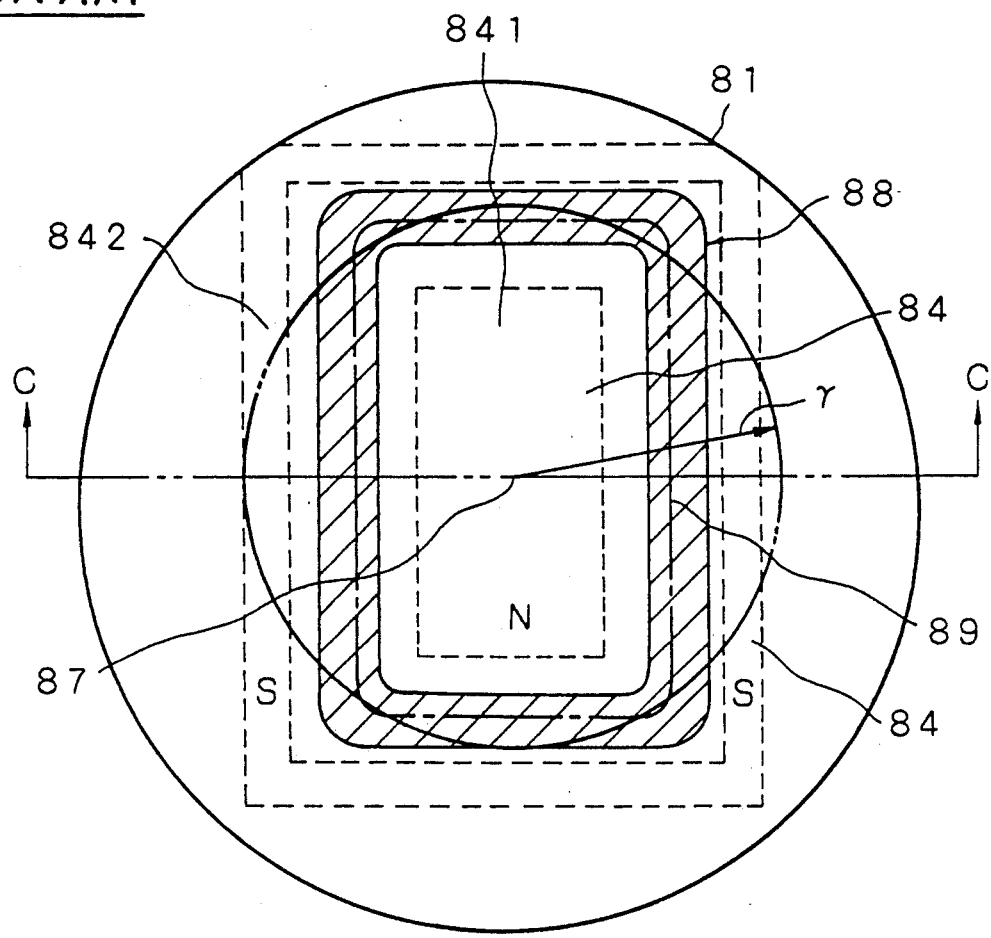
FIG_2
PRIOR ART
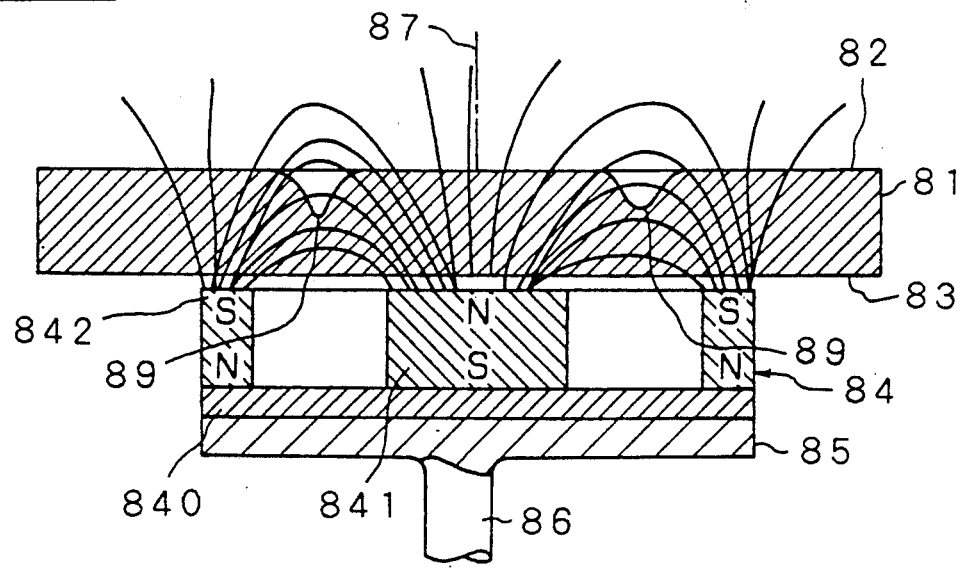

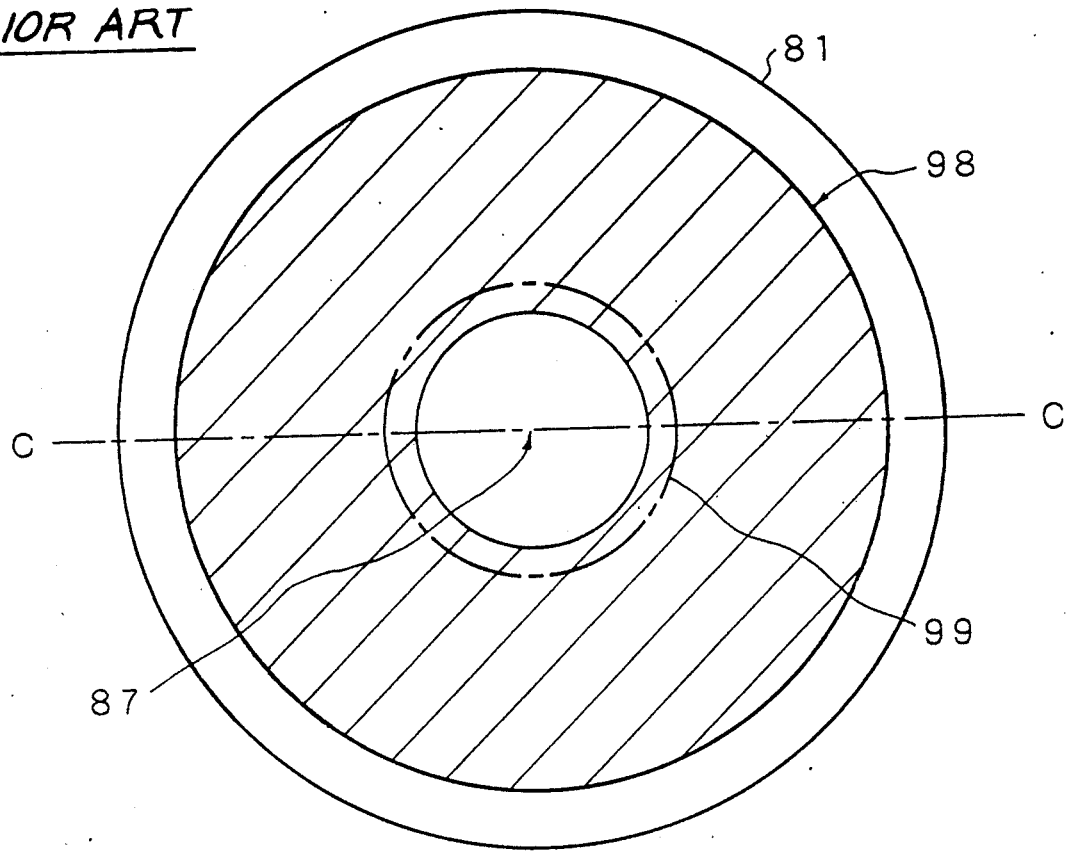
FIG_3
PRIOR ART
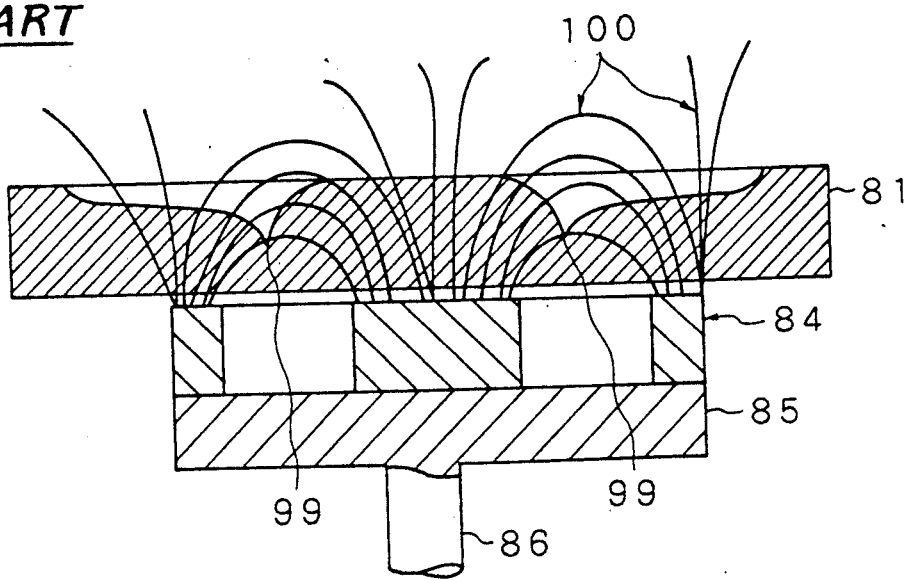
FIG_4
PRIOR ART

FIG_5
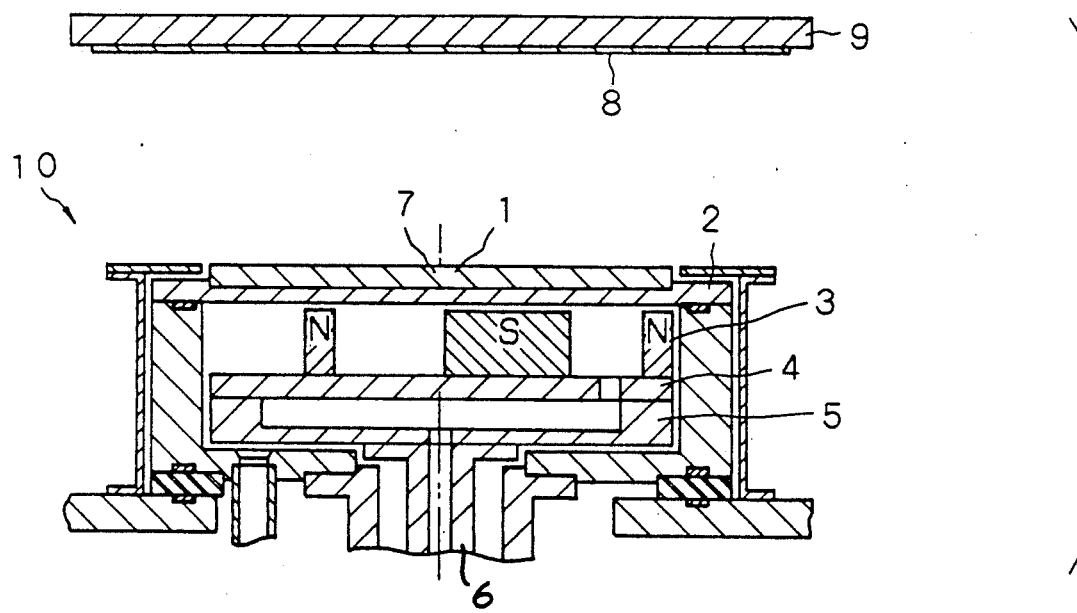

METHOD AND APPARATUS FOR MAGNETRON DISCHARGE TYPE SPUTTERING

BACKGROUND OF THE INVENTION

1. Field of the Invention

This invention relates to a sputtering apparatus for forming thin films in vacuum and, more particularly, to a high-speed low-temperature sputtering apparatus used for forming, on a mass production scale, recording films of magnetic disks or optical magnetic disks or Sendust or Permalloy films as yokes of magnetic heads or thin film magnetic heads by using a target of a magnetic material.

2. Prior Art

Sputtering apparatus of the magnetron discharge type, in which a magnetic field normal to an electric field is provided in the neighborhood of the target surface to trap electrons and produce high density plasma, is thought to be capable of producing a film having a desired thickness quickly and on a mass production basis, and their development is in progress.

Where the magnetic field is fixed for sputtering, the target is locally eroded, and the utility factor is inferior. Accordingly, a system, in which a magnetic field is rotated during sputtering, would provide uniform erosion of the target surface and thus improve the utility factor and extend the life of the target.

FIGS. 1 and 2 are views for explaining target erosion in the prior art. FIG. 1 is a plan view showing a disk-like target, and FIG. 2 is a section taken along line C—C in FIG. 1. The Figures illustrate only a portion of prior art magnetron discharge type sputtering apparatus including the target. In the Figures, a disk-like target 81 has its surface 82 subjected to sputtering a vacuum. Magnetic field application unit 84 is provided on the side a back surface 83 of target 81. It is supported on a turntable 85 for rotation with shaft 86 about center of rotation 87. Magnetic field application unit 84 includes permanent central and other magnets 841 and 842 and yoke 840. The pole surface of central magnet 841 and that of outer magnet 842 are of opposite polarities to each other. Outer magnet 842 is frame-like and surrounds central magnet 841 as will be understood from areas 841 and 842 defined by dashed lines in FIG. 1.

FIG. 1 is a plan view showing the shape of erosion area 88 produced in target 81 in case where the magnetic field is held stationary during sputtering.

Here, erosion area means an entire sputtered area having 5% or more of the maximum erosion depth. Erosion area 88 based on the magnetic field set up by the illustrated magnet array as noted above is substantially rectangular, as shown in the shaded area. A broken line indicates a maximum erosion depth portion 89 of erosion area 88 resulting from quickest erosion. Usually, this portion is substantially linear as is well known in the art. This maximum erosion depth portion is referred to as the quickest erosion portion. The position of the quickest erosion portion 89 can be accurately determined by experiments. However, it can be roughly estimated from the distribution of the magnetic field produced by magnetic field application unit 84.

In the above prior art apparatus, the magnetic field is rotated by operating turntable 85. FIGS. 3 and 4 are views for explaining target erosion in cases where the magnetic field is rotated during sputtering of target 81. As shown in the Figures, erosion area 98 defined by two circles concentric with the center of rotation 87 of the magnetic field (shown shaped in FIG. 4) is formed in the entire area where the field is rotated.

The rate of erosion is not uniform over the surface of target 81. Particularly, there is a strong trend to form a circular groove 99 by strong erosion at a position close to center of rotation 87 of the magnetic field in broad erosion area 98 between concentric circles noted above under rotating magnetic field. If such a circular groove 99 is to be formed in an initial stage of sputtering, this portion of circular groove 99 is subjected to a stronger magnetic field than the field formed in the other sputtering area. Therefore, this portion of groove 99 is subject to acceleratedly quick erosion compared to the rest of the sputtering area, thus increasing the non-uniformity of erosion.

This phenomenon is particularly pronounced where a ferromagnetic target is used. In this case, only the local circular groove 99 is strongly eroded even if the magnetic field is rotated. That is, the magnetic field is rotated. Without effect, resulting in inferior target utility factor. Besides, in this case deterioration of film formation performance on a workpiece substrate (such as film formation rate, film thickness distribution and step cover factor) is inevitable.

There are various proposals of providing for uniform target erosion in order to improve the target utility factor and to solve the problems noted above. Typically, there is a technique disclosed in Japanese Patent Disclosure No. Sho 62-60866. The principles underlying the disclosed technique are as follows. Erosion rate under a stationary magnetic field as shown in FIG. 1 will be considered. Center of rotation of the magnetic field, if caused, is taken as reference point. It is assumed that n plasma groups exist on a circle concentric with the center of rotation 87 and with radius r. It is also assumed that plasma in the same plasma group provides a uniform erosion rate.

The erosion rate provided by plasma is different with different plasma groups. The higher the plasma density is, the higher the erosion rate is. The erosion rate provided by plasma in an i-th plasma group that is found on a circle of radius r is denoted by $R_{ri}$ (Å/min.) (i = 1, 2, . . . , n). It is assumed that plasma groups having the same erosion rate $R_{ri}$ (Å/min.) are found in a circle over a length corresponding to a circumferential angle $\theta_{ri}$ (rad.) ($\theta_{ri}$ being the ratio of the circumferential length of plasma providing the same erosion rate $R_{ri}$ on circle having radius r to distance r from the center of rotation). When the magnetic field is rotated, the erosion rate $D_r$ of various parts of the target on the circle of radius r is the average value of erosion rate $R_{ri}$ noted above and is given as $$D_r = \sum_{i=1}^{n} R_{ri}\theta_{ri}/2\pi \ (\text{Å/min.})$$

Therefore, the following two conditions A and B may be considered.

Condition A: If the afore-mentioned erosion rate $R_{ri}$ under a stationary magnetic field takes a constant value $R_{ri}$ on all points on the circle with radius r and zero in the other area (condition A), we have $$D_r = (R_r/2\pi) \sum_{i=1}^{n} \theta_{ri}$$

This equation can be written as $$D_r = (R_r/2\pi) \sum_{i=1}^{n} (L_{ri}/r)$$

where $L_{ri}$ is the length of arc subtending each angle $\theta_{ri}$.

Condition B: Although $R_r$ generally varies with r, if $R_r$ has a constant value R for each radius r, i.e., irrespective of the radius r (condition B), we may have an equation $$D_r = (R/2\pi) \sum_{i=1}^{n} \theta_{ri}$$

This equation can be rewritten as $$D_r = (R/2\pi) \sum_{i=1}^{n} (L_{ri}/r)$$

In the disclosed technique noted above, both conditions A and B noted above are satisfied substantially over the entire target surface by providing a plurality of magnets having the same shape on the back side of the target in such an arrangement that the term $$\sum_{i=1}^{n} \theta_{ri}$$

and hence $$\sum_{i=1}^{n} (L_{ri}/r)$$

is constant over the entire target surface, thus ensuring uniformity of erosion. In other words, according to this prior art technique erosion is caused likewise and to the same depth over the entire sputtering area of target under a rotating magnetic field. When this is obtained, uniformity of erosion on the target surface can be ensured, and the utility factor of the target can be increased.

In other words, this prior art technique permits improvement of the utility factor of the target when it is used for high-speed low-temperature sputtering using a magnetic target to form, on a mass production scale, large area recording films of magnetic disks and or optical magnetic disks, Sendust or Permalloy films as yokes of magnetic heads or thin film magnetic heads. In this case, however, the thickness of the film deposited on the substrate fluctuates by 5% or above, that is, the thickness distribution of the film is insufficient.

FIG. 10 shows experimental data of the thickness distribution of a film formed on a substrate. In the graph, the abscissa corresponds to the substrate position, and the ordinate corresponds to the film thickness shown in a normalized form with the maximum thickness taken as unity. Dashed plot A represents an example of thickness distribution of a film obtained with the prior art apparatus described above. It will be seen that the maximum-to-minimum thickness ratio is about 1:0.8.

SUMMARY OF THE INVENTION

A first object of the invention is to provide a magnetron discharge type sputtering apparatus, which permits wide and uniform thickness distribution to be obtained.

A second object of the invention is to provide a magnetron discharge type sputtering method for obtaining wide and uniform thickness distribution.

To attain the first object of the invention, there is provided a magnetron discharge type sputtering apparatus for sputtering a target with plasma, which comprises a flat target, a magnetic field application unit disposed in the vicinity of the back surface of said target, and rotating means for rotating a magnetic field provided on the surface of said target by said magnetic field application unit, said magnetic field application unit being constructed such that erosion produced in said target by said sputtering tends to be deeper at the edge portion of an erosion area than the central portion thereof.

In a preferred mode of the invention, said erosion depth is maximum at a position radially spaced apart from the center of said target by a distance corresponding to 50 to 85% of the radius of said target.

In another preferred mode of the invention, said magnetic field application unit has magnetic poles arranged such that, when there are n plasma groups on a circle of a radius r from the center of rotation of the rotating magnetic field, plasma in each plasma group provides an equal erosion rate and an i-th plasma group is found on said circle over an arc $L_{ri}$, the value of $$\sum_{i=1}^{n} (L_{ri}/r)$$

varies with the position on said target in the radial direction.

In a further preferred mode of the invention, said magnetic field application unit has magnetic poles and sets up a magnetic field. The arrangement of the magnetic poles and the strength of the magnetic field are designed such that, when the magnetic field is rotated, there are n plasma groups on a circle of a radius r from the center of rotation of the rotating magnetic field. An erosion rate $D_r$ (Å/min.) of various parts of target on the circle of radius r is given as an equation $$D_r = \sum_{i=1}^{n} R_{ri}\theta_{ri}/2\pi \quad (i = 1, 2, \ldots, n)$$

where $R_{ri}$ (Å/min.) is an erosion rate under a stationary magnetic field provided by plasma in an i-th plasma group that is found on a circle of the radius r. The $R_{ri}$ increases according to the increase of magnetic field strength, and $\theta_{ri}$ is the ratio of the circumferential length of the i-th plasma to distance r from the center of the rotation. The erosion rate $D_r$ becomes larger as the radius r becomes larger. We will refer to various radii on the target as $r_j$, and this expression for the radius may be substituted into the several equations.

In a further preferred mode of the invention, said magnetic field application unit has magnetic poles arranged such that, when there are n plasma groups on a circle of a radius r from the center of rotation of the rotating magnetic field, plasma in each plasma group provides an equal erosion rate. An i-th plama group is found on said circle over an arc $L_{rji}$ and the values of an equation $$\sum_{i=1}^{n} \frac{L_{rji}}{r_j} = \sum_{i=1}^{n} \theta_{rji}$$

where $\theta_{rji}$ is an angle subtended by said arc which is equal at each position on the target in the radial direction. We have used the index i to indicate the several plasma groups which may lie on a circle of a given radius, and for convenience, we have indicated that a circle of radius $r_j$ can have n such plasma groups. It is not necessary that a circle of a different radius must also have n plasma groups. To avoid confusion, we assign the index k to the plasma groups on a circle of a (different) radius $r_{j+1}$ from the center of rotation of the rotating magnetic field, plasma in each plasma group provides an equal erosion rate. There may be m plasma groups on that circle of radius $r_j$. A k-th plasma group is found on such circle of radius $r_{j+1}$ over an arc $L_{rj+1k}$. For the m plasma groups at radius $r_{j+1}$, the following equation results:

$$\sum_{k=1}^{m} \frac{L_{rj+1k}}{r_{j+1}} = \sum_{k=1}^{m} \theta_{rj+1k}$$

where $\theta_{rj+1k}$ is an angle subtended by said arc which is equal at each position on the target in the radial direction. There is a relation between the above two equations:

$$\sum_{i=1}^{n} \theta_{r1i} > \sum_{k=1}^{m} \theta_{r2k}$$

for two radii $r_1$ and $r_2$ were $r_1 > r_2$.

In a still further preferred mode of the invention, said magnetic field application unit is defined in part, by permanent magnets.

To attain the second object of the invention, there is provided a method of sputtering of magnetron discharge type using plasma generated by magnetron discharge for sputtering a flat target, erosion produced in said target by said sputtering tends to be deeper at an edge portion of said target than at a central portion thereof.

In a preferred mode of the invention, the erosion becomes progressively deeper as one goes from the central portion toward the edge portion of said target.

In another preferred mode of the invention, said target is sputtered such that said erosion has a maximum depth at a position radially spaced apart from the center of said target by a distance corresponding from 50 to 85% of the radius of said target.

BRIEF DESCRIPTION OF THE DRAWINGS

In order that the invention may be more clearly understood, preferred embodiments thereof will be described, by way of example, with reference to the accompanying drawings, in which:

FIG. 1 is a plan view showing a prior art magnetron discharge type sputtering apparatus;

FIG. 2 is a sectional view taken along line C—C in FIG. 1;

FIG. 3 is a plan view showing a shape of erosion obtained with a rotating magnetic field provided for sputtering by the prior art magnetron discharge type sputtering apparatus shown in FIGS. 1-2;

FIG. 4 is a sectional view taken along line C—C in FIG. 3;

FIG. 5 is an elevational sectional view showing a substrate and a target section facing the substrate;

DETAILED DESCRIPTION OF PREFERRED EMBODIMENTS

The invention will now be described in conjunction with preferred embodiments thereof with reference to the accompanying drawings. The illustration of the drawings is given schematically so that the invention can be understood.

Figure 6:
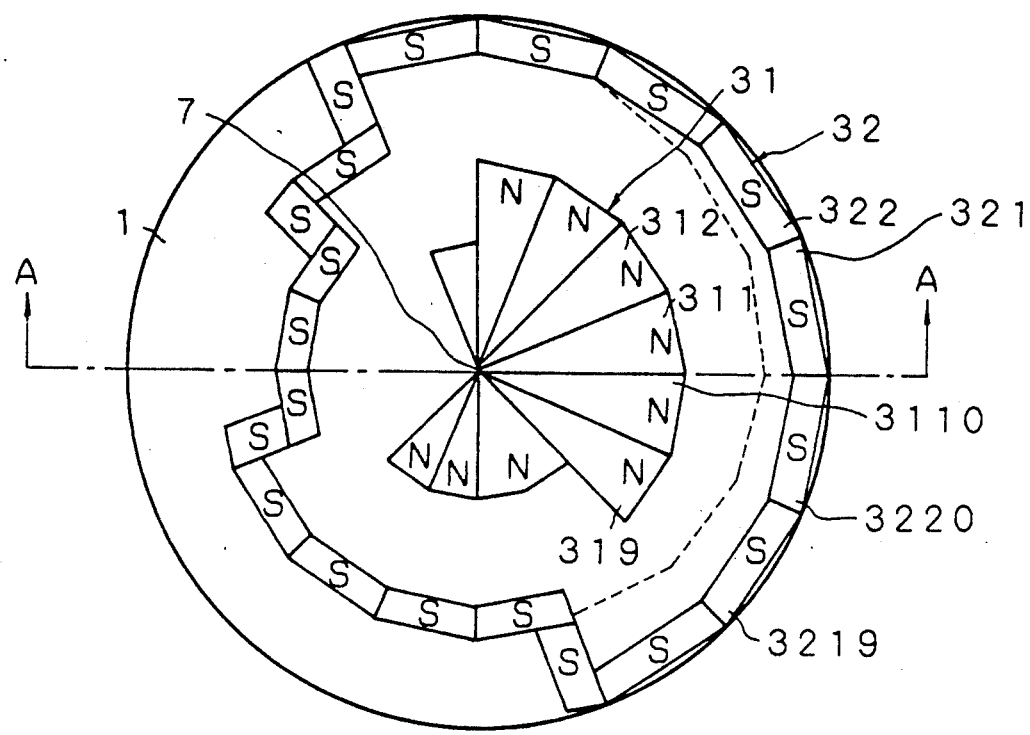
FIG. 6 is a plan view showing the arrangement of magnets on the back surface of a target in an embodiment of the magnetron discharge type sputtering apparatus according to the invention.
Figure 7:
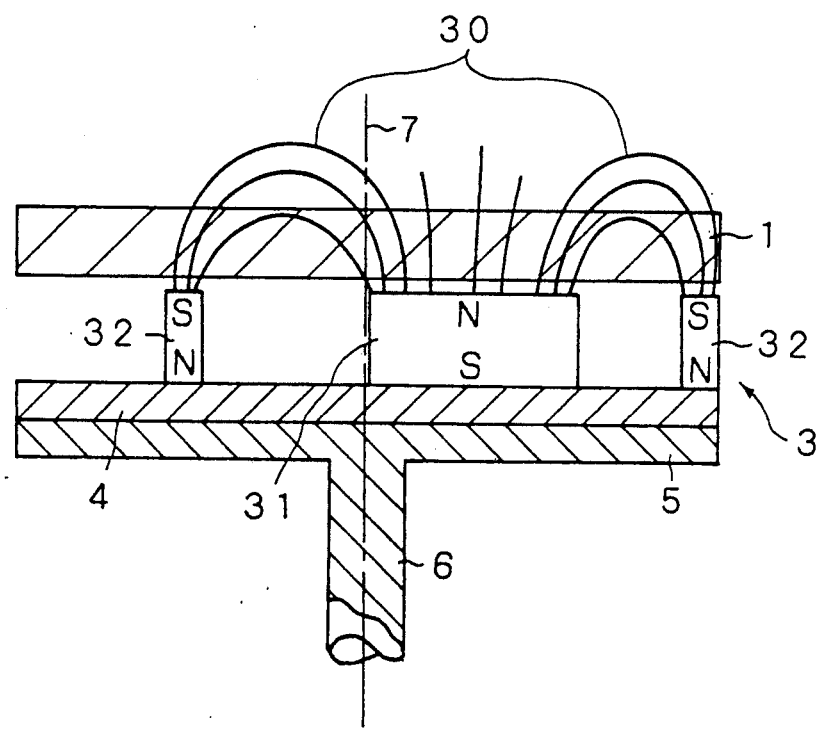
FIG. 7 is a sectional view taken along line A—A in FIG. 7.
Figure 8:
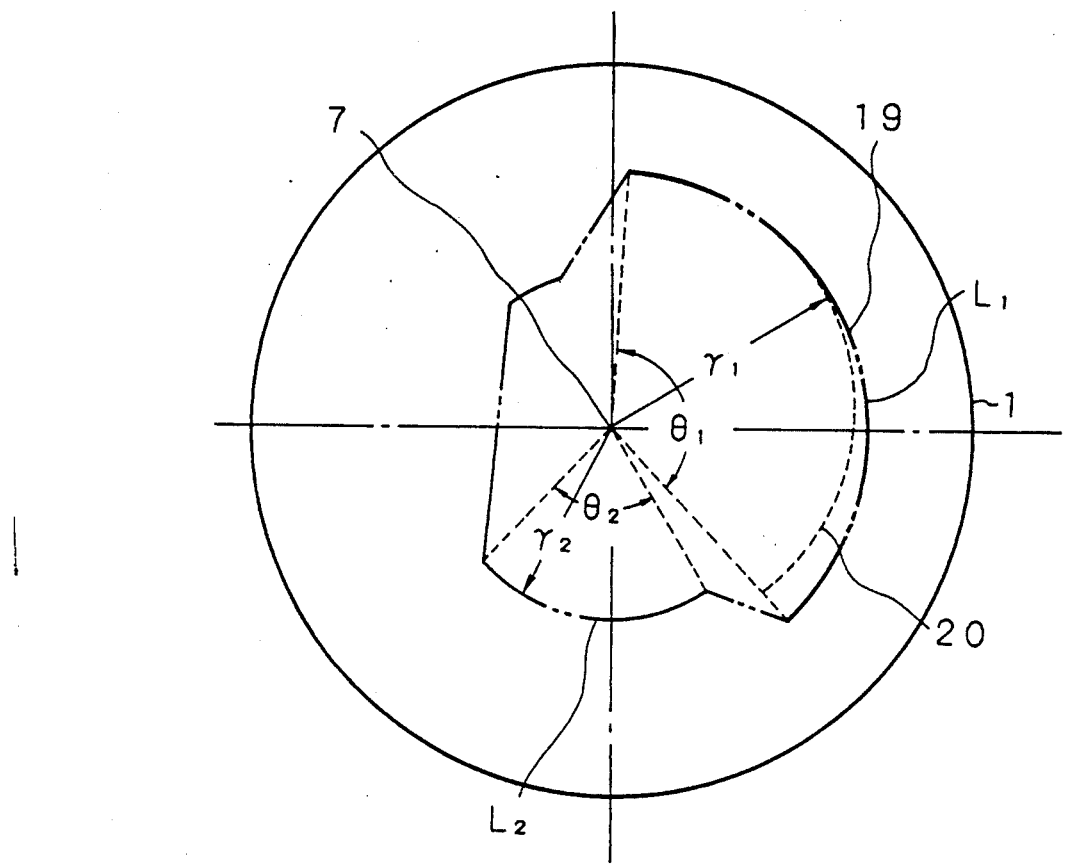
FIG. 8 is a view showing a quickest erosion portion.
Figure 9:
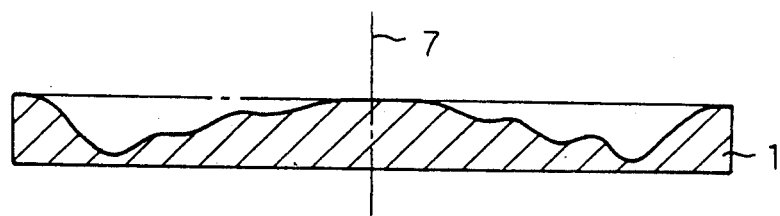
FIG. 9 is a sectional view taken along line A—A in FIG. 6 showing an erosion shape obtained with a rotating magnetic field provided by the embodiment shown in FIGS. 6-7.

FIGS. 5 to 9 illustrate one embodiment of the magnetron discharge sputtering apparatus according to the invention. More specifically, FIG. 5 is an elevational sectional view showing the embodiment of the apparatus. FIG. 6 is a plan view showing an array of magnet poles on the back side of a target. FIG. 7 is a section taken along line A—A in FIG. 6. FIG. 8 illustrates a quickest erosion portion in a stationary magnetic field state. FIG. 9 is a sectional view showing the sectional profile of erosion formed in the target.

FIG. 5 illustrates a main portion of the magnetron discharge type sputtering apparatus, that is, a workpiece substrate and a target section facing the substrate. In FIG. 5, generally designated at 10 is the target section, in which flat target 1 is provided on target holder 2. Below target holder 2, magnetic field application unit 3 consisting of magnets (for instance permanent magnets) is disposed on turntable 5 via yoke 4. Turntable 5 is rotated via a shaft 6 about center of rotation 7 to rotate the magnetic field provided by magnetic field application unit 3. Meanwhile, substrate 8 is provided on a substrate holder 9. Film formation material produced by the sputtering of target 1 is deposited on substrate 8 to form a film.

The components of the apparatus described above are positioned in a vacuum vessel (not shown). In FIG. 5, the surface of target 1, which is a ferromagnetic target facing substrate 8, is sputtered in the vacuum vessel. Magnetic field application unit 3 is provided in the vicinity of the back surface of target 1. As shown in FIGS. 6 and 7, it has an inner permanent magnet group 31 (consisting of permanent magnets 311, 312, ..., 3110) and an outer permanent magnet group 32 (consisting of permanent magnets 321, 322, ..., 3220). These permanent magnet groups are disposed on common yoke 4, and their pole surfaces have opposite polarities to each other. The entire unit is supported on turntable 5 and rotatable by the shaft 6 about the center of rotation 7.

Magnetic field application unit 3 is constructed such that erosion produced in target 1 by sputtering is shallowest in a central portion of the erosion area of target and becomes deeper as one goes toward the outer periphery of the erosion area.

Experiments conducted with magnetic field application unit 3, i.e., under a static magnetic field provided by the array of magnet groups 31 and 32 as shown in FIG. 6, reveal that a quickest erosion portion 19 is formed on the surface of target 1 as shown in FIG. 8.

Meanwhile, experiments conducted with magnetic field application unit 3 rotated for sputtering with respect to target 1, reveal an erosion pattern having a sectional profile as shown in FIG. 9 is obtained. In this case, the film deposited on the substrate 8 has a thickness distribution as shown by solid curve B in FIG. 10.

As is obvious from the experimental results shown by the solid plot in FIG. 9, the erosion produced in the target is shallowest at the center of rotation of the magnetic field and becomes progressively deeper with slight irregularities as one goes radially outwardly from center of rotation 7, and it is deepest at a position near the edge of the erosion area and rapidly becomes shallower as one goes toward the edge. In view of the utility factor of target, the position of the greatest depth of erosion is suitably radially spaced apart from center of rotation 7 of target 1 by 50 to 85% of the radius of target 1.

Figure 10:
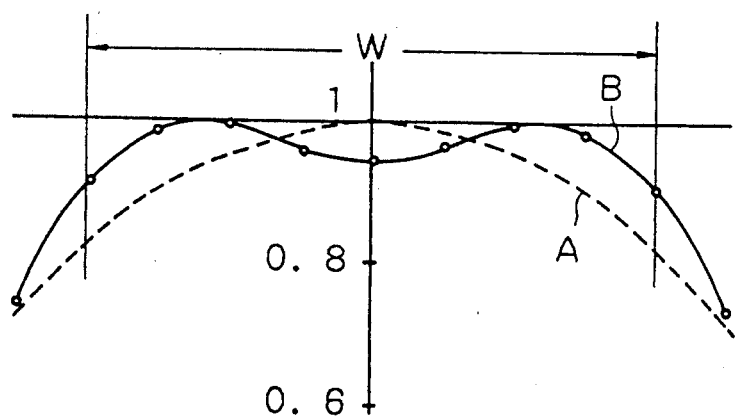
FIG. 10 is a view showing a film thickness distribution.

From the experimental results shown by solid plot B in FIG. 10, the maximum-to-minimum thickness ratio of film deposited on substrate (shown at 8 in FIG. 5) is about 1:0.9. This means that the uniformity of thickness distribution is improved substantially by two times compared to the prior art case (as shown by dashed plot A).

Now, the apparatus and method for sputtering of magnetron discharge type according to the invention, as shown by the experimental results in FIG. 9 and 10, will be described in detail in conjunction with embodiments.

In the embodiment of the invention, unlike the disclosed prior art structure noted above, magnets 31 and 32 are arranged such that $$\sum_{i=1}^{n} \theta_{ri},$$

and hence $$\sum_{i=1}^{n} (L_{ri}/r),$$

are different for different radial directions of the target, while the conditions A and B noted before are substantially satisfied.

This aspect will now be described in greater detail with reference to FIG. 8 showing a quickest erosion portion 19 produced under a stationary magnetic field. As noted supra, particular radii may be referred to as $r = r_j$ or $r_{j+1}$. By substitution, the expressions given supra may now be referred to as follows:

$R_{rji}$ the erosion rate at the jth radius for the ith plasma group when the field is static;

$D_{rj}$ the erosion rate at the jth radius on the target when the field rotates relative to the target;

$\theta_{rji}$ an angular amount (radians) at the jth radius for the ith plasma group; and $L_{rji}$ the length of arc subtending the angular amount $\theta$ at the jth radius for the ith plasma group.

Substituting, the equations for the erosion rate $D_r$ become:

$$D_{rj} = \sum_{i=1}^{n} \frac{R_{rji}\theta_{rji}}{2\pi} = \frac{1}{2\pi} \sum_{i=1}^{n} R_{rji} \frac{L_{rji}}{r_j}$$

In the example of FIG. 8, it is assumed that there is a first plasma group (n=1) with a plasma erosion rate at a distance $r_1$ (a+j=2) from the center of rotation and that there is a second plasma group at a distance $r_2$ (a+j=2) from the rotation center. The erosion rates R or $D_r$ of the first and second plasma groups may be equal or different.

The values of $$\sum_{i=1}^{n} \theta_{ri},$$

and hence $$\sum_{i=1}^{n} (L_{ri}/r),$$

on the circle of radius $r_1$ and vicinity circles with respect to the first plasma group if $\theta_1$ and hence $L_1/r_1$ (i being only one, i.e., n=1). Also, the value of $$\sum_{i=1}^{n} \theta_{ri},$$

and hence $$\sum_{i=1}^{n} (L_{ri}/r),$$

on the circle of radius $r_2$ and vicinity circles with respect to the second plasma group is $\theta_2$ and hence $L_2/r_2$ (here i being also one). That is to say, since there is only one plasma group at $r=r_1$, then n=1 and the summation $\Sigma\theta_{rji}$ (over the range of i=1, ... n) reduces to $\theta_{r1}$. Likewise, at $r=r_2$, there is only one plasma group, and $\Sigma\theta_{rj+1k}$ (over the range of k=1, ... m) becomes $\theta_{r2}$ since m=1. Correspondingly, $$\theta_{r1} = L_1/r_1$$

and $$\theta_{r2} = L_2/r_2$$

It may then be stated:

$$D_{rj} = \sum_{i=1}^{n} \frac{R_{rji}\theta_{rji}}{2\pi} = \frac{1}{2\pi} \sum_{i=1}^{n} \frac{R_{rji}L_{rji}}{r_j}$$

and $$D_{rj+1} = \sum_{k=1}^{m} \frac{R_{rj+1k}\theta_{rj+1k}}{2\pi} = \frac{1}{2\pi} \sum_{k=1}^{m} R_{rj+1k} \frac{L_{rj+1k}}{r_{j+1}}$$

by simple substitution. In other words:

$$D_{r1} = \frac{1}{2\pi} \frac{R_{r1}}{r_1}$$

and

-continued $$D_{r2} = \frac{1}{2\pi} \frac{R_{r2}}{r_2}$$

and the FIG. 8 embodiment. In this embodiment, the poles of the magnetic field application unit are arranged such that $\theta_1 > \theta_2$ for the radii $r_1$ and $r_2$ ($r_1 > r_2$). This arrangement is different from the disclosed prior art technique noted above.

With this magnetron discharge type sputtering apparatus, when the turntable 5 is turned to rotate the magnetic field during sputtering with respect to a target 1, a wide and waste-free erosion area can be ensured, while obtaining quicker, and hence deeper, erosion in the edge portion of target 1 than the central portion thereof, as shown in FIG. 9.

Since such an erosion profile can be obtained, it is possible to deposit a film having a uniform thickness over a wider area of substrate 8 while maintaining a high utility factor of the target 1.

The invention is applicable as well to an apparatus in which the conditions A and B are not satisfied.

For example, as in the prior art technique noted above, the angles $\theta_1$ and $\theta_2$ in quickest erosion section 19 in FIG. 8 are set to be $\theta_1 = \theta_2$, while only four magnets 321, 322, 3220 and 3219 and respectively corresponding magnets 311, 312, 319 and 3110 are made stronger than the other magnets. That is, an erosion rate under the stationary magnetic field increases according to the increase of magnetic field strength. In this case, R varies on the circle of radius $r_1$ depending on the angle and also varies depending on the radius r (i.e., with $r_1$ and $r_2$). Thus, there holds a relation $D_{r1} > D_{r2}$, and the apparatus having the construction according to the invention can be obtained.

It it is desired to obtain an erosion profile free from depressed portions as shown by the dashed plot in FIG. 9, the arrangement of outer magnets 32 shown in FIG. 6 is changed as shown by the dashed line, thus producing the magnetic field application unit 3 having a pole arrangement to provide a quickest erosion portion as shown by dashed line 20 in FIG. 8. By so doing, the intended erosion profile can be obtained.

In the above embodiment, the target 1 is held stationary while the magnetic field application unit 3 is rotated. However, it is also possible to rotate the former while holding the latter stationary. Further, it is possible to use electromagnets instead of the permanent magnets for the magnetic field application unit.

According to the invention, it is possible to provide greatly improved magnetron discharge type sputtering apparatus, which permits quick formation of a uniform film on a substrate while holding a high utility factor of the target.

What is claimed is:

1. A magnetron discharge type cathode for a sputtering apparatus comprising:
   a flat circular target;
   a magnetic field application unit disposed on the back side of the flat circular target, and
   rotating means for rotating the magnetic field provided on the front surface of said flat circular target by said magnetic field application unit;
   wherein said magnetic field application unit has magnetic poles and sets up a magnetic field, the arrangement of the magnetic poles and the strength of the magnetic field being such that, when the magnetic field is rotated,
   there are n plasma groups on the j-th circle of a radius $r_j$ from the center of rotation of the rotating magnetic field, and m plasma groups on the j+1 th circle of a radius $r_{j+1}$ from the center of rotation of the rotating magnetic field, and
   wherein said circular target erodes at an erosion rate $D_{rj}$(Å/min) for parts of said target on the j th circle of radius $r_j$ and said target erodes at an erosion rate $D_{rj+1}$ (Å/min) for parts of said flat circular target on the j+1 th circle of radius $r_{j+1}$ in accordance with the equations, respectively:

$$D_{rj} = \sum_{i=1}^{n} \frac{R_{rji}\theta_{rji}}{2\pi} = \frac{1}{2\pi} \sum_{i=1}^{n} \frac{R_{rji}L_{rji}}{r_j}$$

and $$D_{rj+1} = \sum_{k=1}^{m} \frac{R_{rj+1k}\theta_{rj+1k}}{2\pi} = \frac{1}{2\pi} \sum_{k=1}^{m} R_{rj+1k}\frac{L_{rj+1k}}{r_{j+1}}$$

where i, j, and k are positive integers, respectively,
where $R_{rji}$ and $R_{rj+1k}$ (Å/min) are the erosion rates under a stationary magnetic field provided by the i-th plasma group that is found on the j-th circle of the radius $r_j$, and that provided by the k th plasma group that is found on the j+1 th circle of the radius $r_{j+1}$, respectively, and which erosion rates increase according to the increase of magnetic field strength,
where $\theta_{rji}$ and $\theta_{rj+1k}$ are circumferential angles provided by a ratio of an arc length $L_{rji}$ or the i-th plasma to distance $r_j$ from the center of rotation and by a ratio of an arc length $L_{rj+1k}$ of the k th plasma group to a distance $r_{j+1}$ from the center of rotation, and
where there is a relation $D_{rj} > D_{rj+1}$ for the radius $r_j$ of the j-th circle and the radius $r_{j+1}$ of the j+1-th circle ($r_j > r_{j+1}$).

2. A magnetron discharge type cathode according to claim 1, wherein said magnetic field application unit is constructed such that erosion becomes progressively deeper in said flat circular target as the erosion area extends from the central portion of said circular flat target toward the edge portion thereof.

3. A magnetron discharge type cathode according to claim 2, wherein said magnetic field application unit is constructed such that the erosion is deeper at the edge portion of said erosion area than at the central portion thereof.

4. A magnetron discharge type cathode according to claim 1, wherein said magnetic filed application unit is constructed such that the erosion has a maximum depth at a position radially spaced apart from the center of said circular flat target by a distance corresponding to 50 to 85% of the radius thereof.

5. A magnetron discharge type cathode according to claim 1, wherein said magnetic field application unit is comprised of permanent magnets.

6. A magnetron discharge type cathode according to claim 1, wherein said flat circular target is made of ferromagnetic material.

7. A magnetron discharge type cathode according to claim 1 wherein said magnetic field application unit has said magnetic poles arranged such that, when said erosion rates $R_{rji}$ and $R_{rj+1k}$ under the stationary magnetic field are a constant value R across the whole surface of said flat circular target, and said erosion rate $D_{rj}$ and $D_{rj+1}$ (Å/min) are given as respective equations:

$$D_{rj} = \frac{R}{2\pi} \sum_{i=1}^{n} \theta_{rji} = \frac{R}{2\pi} \sum_{i=1}^{n} \frac{L_{rji}}{r_j}$$

and $$D_{rj+1} = \frac{R}{2\pi} \sum_{k=1}^{m} \theta_{rj+1k} = \frac{R}{2\pi} \sum_{k=1}^{m} \frac{L_{rj+1k}}{r_{j+1}}$$

there is a relationship $$\sum_{i=1}^{n} \theta_{rji} > \sum_{k=1}^{m} \theta_{rj+1k}$$

where the radius $r_j$ of the j-th circle is larger than the radius $r_{j+1}$ of the j+1-th circle ($r_j > r_{j+1}$).

8. A magnetron discharge type cathode according to claim 7 wherein, for two radii $r_1$ and $r_2$ ($r_1 > r_2$), there is a relation $$\sum_{i=1}^{n} \theta_{r1i} > \sum_{k=1}^{m} \theta_{r2k}$$

9. A magnetron discharge type cathode according to claim 8 wherein when there is one and only one plasma group on a circle with a radius $r_1$ from the center of rotation of the rotating magnetic filed (i.e., n=1) and there is one and only one plasma group on a circle with a radius $r_2$ from the center of rotation of the rotating magnetic field (i.e., m=1), it holds that $$\sum_{i=1}^{n} \theta_{r1i} = \theta_{r1}$$

and $$\sum_{k=1}^{m} \theta_{r2k} = \theta_{r2}$$

and there is a relation $\theta_{r1} > \theta_{r2}$ for for two radii $r_1$ and $r_2$ ($r_1 > r_2$).

10. A magnetron discharge type cathode according to claim 12 wherein there is a relation $$\sum_{i=1}^{n} R_{r1i} > \sum_{k=1}^{m} R_{r2k}$$

for two radii $r_1$ and $r_2$ ($r_1 > r_2$).

11. A magnetron discharge type cathode according to claim 10 wherein when there is one and only one plasma group on a circle with a radius $r_1$ from the center of rotation of the rotating magnetic field, so that n=1, and there is one and only one plasma group on a circle with a radius $r_2$ from the center of rotation of the rotating magnetic field, so that m=1, then $$\sum_{i=1}^{n=1} R_{r1i} = R_{r1}$$

and $$\sum_{k=1}^{m=1} R_{r2k} = R_{r2}$$

and there is a relation $R_{r1} > R_{r2}$ for two radii $r_1$ and $r_2$ ($r_1 > r_2$).

12. A magnetron discharge type cathode according to claim 1 wherein said magnetic field application unit has an arrangement of said magnetic poles such that, when said $\theta_{rji}$ and $\theta_{rj+1k}$ are constant values $\theta$, and said erosion rate $D_{rj}$ and $D_{rj+1}$ (Å/min) are given as respective equations:

$$D_{rj} = \frac{\theta}{2\pi} \sum_{i=1}^{n} R_{rji}$$

$$D_{rj+1} = \frac{\theta}{2\pi} \sum_{k=1}^{m} R_{rj+1k}.$$

there is a relationship $$\sum_{i=1}^{n} R_{rji} > \sum_{k=1}^{m} R_{rj+1k}$$

where the radius $r_j$ of the j-th circle is larger than the radius $r_{j+1}$ of the j+1-th circle ($r_j > r_{j+1}$), that is, the magnetic field for the i-th plasma group on the j-th circle is larger in strength than that for the k-th plasma group on the j+1-th circle.

13. A method for sputtering a flat circular target using plasma generated by a magnetron discharge type cathode, comprising;

applying a magnetic field to said flat circular target by magnetic poles disposed in back of said flat circular target, rotating the magnetic field provided on the front surface of said flat circular target by said magnetic field application, and arranging said magnetic poles and the strength of said magnetic field such that, when said magnetic field is rotated, there are n plasma groups on a j-th circle of a radius $r_j$ from the center of rotation of the rotating magnetic field and m plasma groups on the j+1 th circle of a radius $r_{j+1}$ from the center of rotation of the rotating magnetic field, and an erosion rate $D_{rj}$ (Å/min) of various parts of said flat circular target on the j-th circle of radius $r_j$ and that said target erodes at an erosion rate $D_{rj+1}$ (Å/min) for parts of said flat circular target on the j+1 th circle of radius $r_{j+1}$ in accordance with the equations, respectively:

$$D_{rj} = \sum_{i=1}^{n} \frac{R_{rji}\theta_{rji}}{2\pi} = \frac{1}{2\pi} \sum_{i=1}^{n} \frac{R_{rji}L_{rji}}{r_j}$$

and $$D_{rj+1} = \sum_{k=1}^{m} \frac{R_{rj+1k}\theta_{rj+1k}}{2\pi} = \frac{1}{2\pi} \sum_{k=1}^{m} R_{rj+1k}\frac{L_{rj+1k}}{r_{j+1}}$$

where i, j, and k are each positive integers, where $R_{rji}$ and $R_{rj+1k}$ (Å/min) are the erosion rates under a stationary magnetic field provided by the i-th plasma group that is found on the j-th circle of the radius $r_j$, and that provided by the k th plasma group that is found on the j+1 th circle of the radius $r_{j+1}$, respectively, and which erosion rates increase according to the increase of magnetic field strength, and where $\theta_{rji}$ and $\theta_{rj+1k}$ are the ratio of the arc length $L_{rji}$ of the i-th plasma to distance $r_j$ from the center of rotation, and the ratio of the arc length $L_{rj+1k}$ of the i-th plasma to a distance $r_{j+1}$ from the center of rotation, respectively, and wherein $D_{rj} > D_{rj+1}$ where the radius $r_j$ of the j-th circle is larger than the radius $r_{j+1}$ of the j+1-th circle ($r_j > r_{j+1}$).

14. The method according to claim 13, wherein said arrangement of said magnetic poles is such that when said erosion rates $R_{rji}$ and $R_{rj+1k}$ under stationary magnetic field have constant values R at all points on the whole surface of said flat circular target and said erosion rates $D_{rj}$ and $D_{rj+1}$ (Å/min) are given as equations, respectively:

$$D_{rj} = \frac{R}{2\pi} \sum_{i=1}^{n} \theta_{rji} = \frac{R}{2\pi} \sum_{i=1}^{n} \frac{L_{rji}}{r_j}$$

and $$D_{rj+1} = \frac{R}{2\pi} \sum_{k=1}^{m} \theta_{rj+1k} = \frac{R}{2\pi} \sum_{k=1}^{m} \frac{L_{rj+1k}}{r_{j+1}}$$

where $\theta_{rji}$ is an angle subtended by an arc $L_{rji}$ on the j-th circle over which the i-th plasma group is found, there is a relation $$\sum_{i=1}^{n} \theta_{r1i} > \sum_{k=1}^{m} \theta_{r2k}$$

where the radius $r_j$ of the j-th circle is larger than the radius $r_{j+1}$ of the j+1-th circle ($r_j > r_{j+1}$).

15. The method according to claim 14 wherein $$\sum_{i=1}^{n} \theta_{r1i} > \sum_{k=1}^{m} \theta_{r2k}$$

for two radii $r_1$ and $r_2$ ($r_1 > r_2$).

16. The method according to claim 15 wherein when there is one and only one plasma group on a circle with a radius $r_1$ from the center of rotation of the rotating magnetic filed, so that n=1, and there is one and only one plasma group on a circle with a radius $r_2$ from the center of rotation of the rotating magnetic field, so that m=1, it holds that $$\sum_{i=1}^{n} \theta_{r1i} = \theta_{r1}$$

and $$\sum_{k=1}^{m} \theta_{r2k} = \theta_{r2}$$

and there is a relation $\theta_{r1} > \theta_{r2}$ for two radii $r_1$ and $r_2$ ($r_1 > r_2$).

17. The method according to claim 13 wherein said arrangement of said magnetic poles is such that, when said angle $\theta_{rji}$ subtended by said arc length $L_{rji}$ and $\theta_{rj+1k}$ subtended by said arc length $L_{rj+1k}$ are constant values $\theta$, respectively, and wherein said erosion rates $D_{rj}$ and $D_{rj+1}$ (Å/min) are given as respective equations:

$$D_{rj} = \frac{\theta}{2\pi} \sum_{i=1}^{n} R_{rji}$$

and $$D_{rj+1} = \frac{\theta}{2\pi} \sum_{k=1}^{m} R_{rj+1k}$$

$$D_{rj} = \frac{\theta}{2\pi} \sum_{i=1}^{n} R_{rji}$$

$$D_{rj+1} = \frac{\theta}{2\pi} \sum_{k=1}^{m} R_{rj+1k},$$

there is a relation:

$$\sum_{i=1}^{n} R_{r1i} > \sum_{k=1}^{m} R_{r2k}$$

where the radius $r_j$ of the j-th circle is larger than the radius $r_{j+1}$ of the j=1-th circle ($r_j > r_{j+1}$), that is, the magnetic field for the i-th plasma group on the j-th circle is larger in strength than that for the k-th plasma group on the j+i-th circle.

18. The method according to claim 17 wherein $$\sum_{i=1}^{n} R_{r1i} > \sum_{k=1}^{m} R_{r2k}$$

for two radii $r_1$ and $r_2$ ($r_1 > r_2$).

19. The method according to claim 18 wherein when there is one and only one plasma group on a circle with a radius $r_1$ from the center of rotation of the rotating magnetic field, so that n=1, and there is one and only one plasma group on a circle with a radius $r_2$ from the center of rotation of the rotating magnetic field, so that m=1, then $$\sum_{i=1}^{n=1} R_{r1i} = R_{r1}$$

and $$\sum_{k=1}^{m=1} R_{r2k} = R_{r2}$$

and there is a relation $R_{r1} > R_{r2}$ for two radii $r_1$ and $r_2$ ($r_1 > r_2$).

* * * * *